US012807754B2

(12) United States Patent
Yang et al.

(10) Patent No.: US 12,807,754 B2
(45) Date of Patent: Nov. 24, 2026

(54) COVER WINDOW AND DISPLAY DEVICE INCLUDING THE SAME

(71) Applicant: ELECTRONICS AND TELECOMMUNICATIONS RESEARCH INSTITUTE, Daejeon (KR)

(72) Inventors: Woo Seok Yang, Daejeon (KR); Sunghoon Hong, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 373 days.

(21) Appl. No.: 18/508,041

(22) Filed: Nov. 13, 2023

(65) Prior Publication Data

US 2024/0182628 A1 Jun. 6, 2024

(30) Foreign Application Priority Data

Nov. 14, 2022 (KR) ........................ 10-2022-0151461
Apr. 12, 2023 (KR) ........................ 10-2023-0047923

(51) Int. Cl.
*C08G 18/38* (2006.01)
*H10K 59/80* (2023.01)
*H10K 71/15* (2023.01)

(52) U.S. Cl.
CPC ....... *C08G 18/3819* (2013.01); *H10K 59/872* (2023.02); *H10K 71/15* (2023.02)

(58) Field of Classification Search
CPC ............................. H10K 71/15; H10K 59/872
See application file for complete search history.

(56) References Cited

U.S. PATENT DOCUMENTS

| | | | |
|---|---|---|---|
| 10,877,302 B2 | 12/2020 | Shin et al. | |
| 11,948,481 B2 | 4/2024 | Lee et al. | |
| 2010/0048832 A1 | 2/2010 | Vedage et al. | |
| 2010/0127415 A1 | 5/2010 | Kim et al. | |
| 2011/0076485 A1 | 3/2011 | Yakulis, Jr. et al. | |
| 2012/0306790 A1 | 12/2012 | Kyung et al. | |
| 2021/0070650 A1 | 3/2021 | Da et al. | |
| 2022/0078936 A1* | 3/2022 | Doi | B29C 45/14 |

FOREIGN PATENT DOCUMENTS

| | | |
|---|---|---|
| KR | 10-2011-0129838 A | 12/2011 |
| KR | 10-2012-0073308 A | 7/2012 |
| KR | 10-1484986 B1 | 1/2015 |
| KR | 10-2018-0133014 A | 12/2018 |
| KR | 10-2021-0013709 A | 2/2021 |
| KR | 10-2021-0079099 A | 6/2021 |
| KR | 10-2022-0022501 A | 2/2022 |
| KR | 10-2022-0052418 A | 4/2022 |

OTHER PUBLICATIONS

Desmophen NH-1420, product data sheet, Aug. 23, 2018.*

* cited by examiner

*Primary Examiner* — Michael L Leonard

(57) ABSTRACT

Provided is a cover window including a film portion on the substrate. The cover window may include a substrate, and a film portion on the substrate. The film portion includes polyurea, wherein the polyurea may be a polymer formed through a urea bond between an aliphatic polyisocyanate and an aliphatic polyamine.

17 Claims, 3 Drawing Sheets

COVER WINDOW AND DISPLAY DEVICE INCLUDING THE SAME

CROSS-REFERENCE TO RELATED APPLICATIONS

This U.S. non-provisional patent application claims priority under 35 U.S.C. § 119 of Korean Patent Application Nos. 10-2022-0151461, filed on Nov. 14, 2022, and 10-2023-0047923, filed on Apr. 12, 2023, the entire contents of which are hereby incorporated by reference.

BACKGROUND

The present disclosure herein relates to a display device, and more particularly, to a cover window and a display device including the same.

A cover window of a display device is required to deliver a clear image while protecting a display unit from external impacts. Accordingly, the cover window is required to have excellent mechanical durability and visible light transmittance. In addition, in order to be applied to a flexible display, the cover window is required to have bending properties.

Ultra-thin glass (UTG), manufactured by performing chamfering and chemical strengthening processes on glass, has an advantage of high visibility and surface hardness, but has a problem of low impact strength.

SUMMARY

The present disclosure provides a cover window having improved visibility and durability, and a manufacturing method thereof.

The present disclosure also provides a display device including a cover window having improved visibility and durability.

An embodiment of the inventive concept provides a cover window including a substrate, and a film portion on the substrate, wherein the film portion includes polyurea, wherein the polyurea is a polymer formed through a urea bond between an aliphatic polyisocyanate and an aliphatic polyamine.

In an embodiment, the aliphatic polyisocyanate may include a hexamethylene diisocyanate oligomer.

In an embodiment, the hexamethylene diisocyanate oligomer may include at least one of oligomers represented by Formula 1, Formula 2, and Formula 3.

[Formula 1]

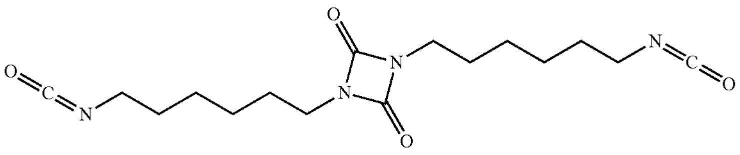

[Formula 2]

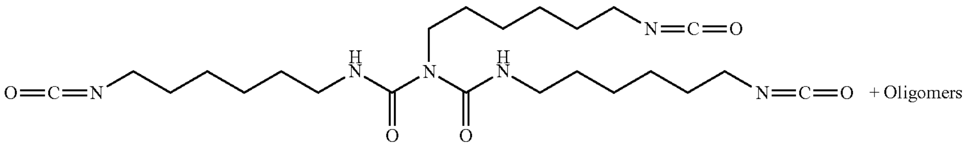

[Formula 3]

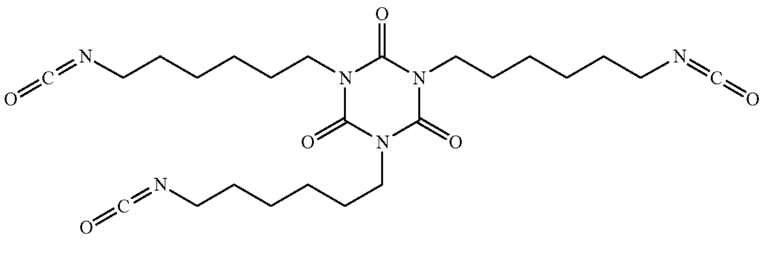

-

In an embodiment, the hexamethylene diisocyanate oligomer may have a content of a —N=C=O group of about 16 wt % to about 24 wt %.

In an embodiment, the aliphatic polyamine may include a polyaspartic ester, and the amine value of the aliphatic polyamine may be about 180 mg KOH/g to about 210 mg KOH/g.

In an embodiment, the aliphatic polyamine may include at least one of a material represented by Formula 4 and a material represented by Formula 5.

[Formula 4]

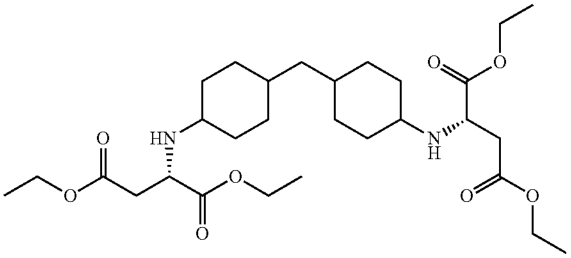

[Formula 5]

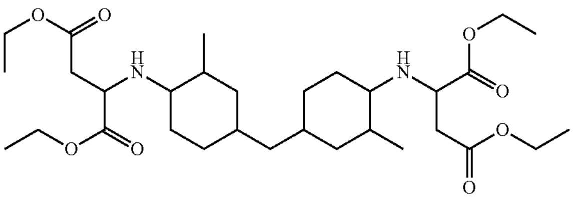

In an embodiment, the thickness of the film portion may be about 0.5 times to about 1 time the thickness of the substrate.

In an embodiment, the thickness of the substrate may be about 30 μm to about 70 μm.

In an embodiment of the inventive concept, a display device includes a display unit, and a cover window on the display unit, wherein the cover window includes a substrate and a film portion, wherein the film portion includes polyurea, wherein the polyurea is a polymer formed through a urea bond between an aliphatic polyisocyanate and an aliphatic polyamine.

In an embodiment, the aliphatic polyisocyanate may include a hexamethylene diisocyanate oligomer, wherein the hexamethylene diisocyanate oligomer may have a content of a —N═C═O group of about 16 wt % to about 24 wt %.

In an embodiment, the hexamethylene diisocyanate oligomer may include at least one of oligomers represented by Formula 1, Formula 2, and Formula 3.

[Formula 1]

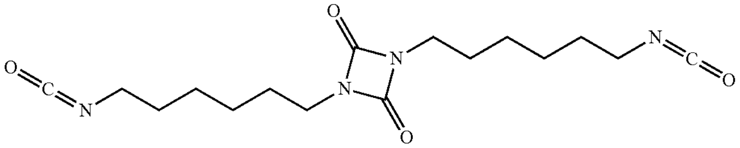

[Formula 2]

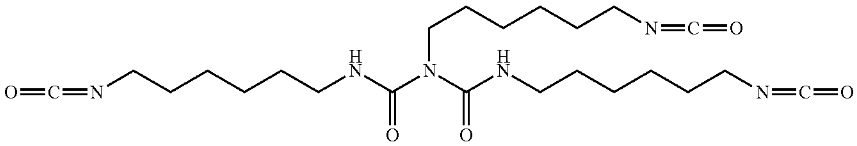 + Oligomers

[Formula 3]

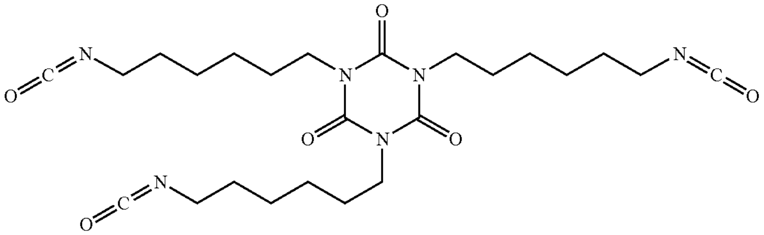

In an embodiment, the aliphatic polyamine may include at least one of a material represented by Formula 4 and a material represented by Formula 5.

[Formula 4]

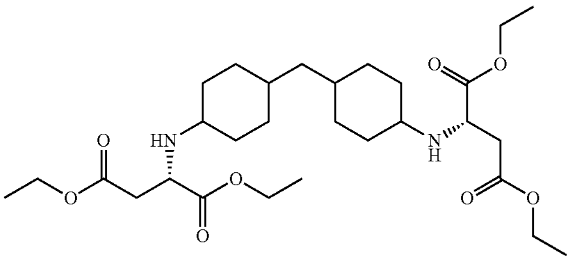

-continued

[Formula 5]

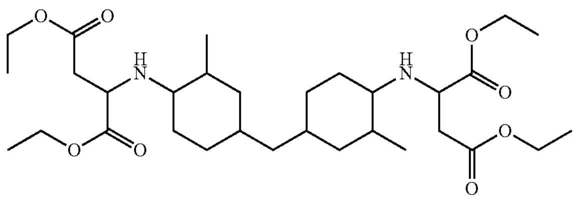

In an embodiment, the cover window may further include an anti-fingerprint layer and a pressure-sensitive adhesive layer, wherein the anti-fingerprint layer may be disposed on the substrate, and the pressure-sensitive adhesive layer may be interposed between the film portion and the display unit.

In an embodiment of the inventive concept, a method for manufacturing a cover window includes preparing a first substance including an aliphatic polyisocyanate and a second substance including an aliphatic polyamine, preparing a coating solution by mixing the first substance and the second substance, coating the coating solution on a substrate S30, and forming a film portion by curing the coating solution.

In an embodiment, the preparing of the first substance and the second substance may include dissolving each of the aliphatic polyisocyanate and the aliphatic polyamine in a solvent, wherein the solvent may be acetone or methylethylketone.

In an embodiment, the preparing of the coating solution by mixing the first substance and the second substance may include performing the mixing such that the ratio of the number of —N═C═O groups in the first substance and the number of —NH groups in the second substance is 1:1.

In an embodiment, the coating of the coating solution on the substrate may be performed by a spin coating process.

In an embodiment, the forming of the film portion by curing the coating solution may include performing a heat treatment process on the coating solution, wherein the heat treatment process may be performed at a pressure of about 760 Torr to about 0.1 Torr and a temperature of about 60° C. to about 100° C.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
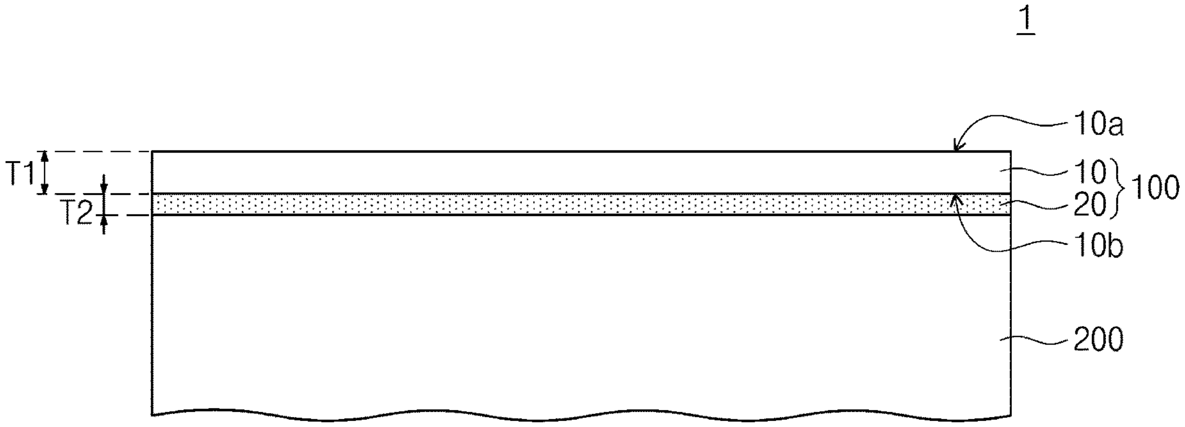
FIG. 1 is a cross-sectional view showing a portion of a display device according to an embodiment of the inventive concept.

In order to facilitate sufficient understanding of the configuration and effects of the inventive concept, preferred embodiments of the inventive concept will be described with reference to the accompanying drawings. However, the inventive concept is not limited to the embodiments set forth below, and may be embodied in various forms and modified in many alternate forms. Rather, these embodiments are provided so that this disclosure will be thorough and complete, and will fully convey the scope of the inventive concept to those skilled in the art to which the inventive concept pertains. Those skilled in the art will understand that the inventive concept may be performed in any suitable environment.

The terms used herein are for the purpose of describing embodiments and are not intended to be limiting of the inventive concept. In the present specification, singular forms include plural forms unless the context clearly indicates otherwise. As used herein, the terms "comprises" and/or "comprising" are intended to be inclusive of the stated elements, steps, operations and/or devices, and do not exclude the possibility of the presence or the addition of one or more other elements, steps, operations, and/or devices.

In the present disclosure, when any film (or layer) is referred to as being on another film (or layer) or substrate, it means that the film may be directly formed on another film (or layer) or substrate, or that a third film (or layer) may be interposed therebetween.

Although the terms first, second, third, and the like are used in various embodiments of the present disclosure to describe various regions, films (or layers), and the like, these regions, films, and the like should not be limited by these terms. These terms are only used to distinguish any predetermined region or film (or layer) from another region or film (or layer). Thus, a film referred to as a first film in one embodiment may be referred to as a second film in another embodiment. Each embodiment described and exemplified herein also includes its complementary embodiment. Like reference numerals refer to like elements throughout the specification.

Unless otherwise defined, terms used in the embodiments of the inventive concept may be interpreted as meanings commonly known to those skilled in the art.

Hereinafter, embodiments of the inventive concept will be described with reference to the accompanying drawings.

FIG. 1 is a cross-sectional view showing a portion of a display device according to an embodiment of the inventive concept.

Referring to FIG. 1, a display device 1 may include a cover window 100 and a display unit 200. The cover window 100 may be disposed on the display unit 200. A lower surface of the cover window 100 may be in contact with an upper surface of the display unit 200. The cover window 100 may cover the upper surface of the display unit 200. The display unit 200 may display images. The display unit 200 may include at least one of an organic light emitting diode OLED and a micro-LED.

The cover window 100 may include a substrate 10 and a film portion 20. The substrate 10 may be disposed on the film portion 20. The substrate 10 may have a first surface **10*a* and a second surface 10*b* which oppose each other. The display unit 200 may be adjacent to the second surface 10*b* of the substrate 10. The film portion 20 may be disposed on the second surface 10*b* of the substrate 10. The film portion 20 may be interposed between the second surface 10*b* of the substrate 10 and the display unit 200. The film portion 20** may cover the second surface 10*b* of the substrate 10 and the upper surface of the display unit 200.

The substrate 10 may include glass. The substrate 10 may be ultra-thin glass (UTG). A thickness T1 of the substrate 10 may be about 30 μm to about 70 μm. The surface hardness of the substrate 10 may be a pencil hardness of about 9 H. A thickness T2 of the film portion 20 may be about 0.5 times to about 1 time the thickness T1 of the substrate 10. The surface hardness of the film portion 20 may be a pencil hardness of about 2 H to about 4 H. The visible light transmittance of the film unit 20 may be about 90% or greater. The thickness T2 of the film portion 20 may be about 0.5 times to about 1 time the thickness T1 of the substrate 10, and the impact strength of the substrate 10 may be improved.

The film portion 20 may include polyurea. The polyurea may be a polymer formed through a urea bond between an aliphatic polyisocyanate and an aliphatic polyamine. Since an aliphatic polyisocyanate and an aliphatic polyamine are used to form polyurea, visible light transmittance may be improved, and a yellowing phenomenon may be prevented when exposed to ultraviolet rays.

The aliphatic polyisocyanate may include a hexamethylene diisocyanate (HDI) oligomer or an isophorone diisocyanate (IPDI) oligomer. Preferably, the aliphatic polyisocyanate may include a hexamethylene diisocyanate oligomer. The hexamethylene diisocyanate oligomer may include at least one of uretdione represented by Formula 1 below, biuret represented by Formula 2 below, or isocyanurate represented by Formula 3 below. The uretdione may have a bimer form. The biuret and the isocyanurate may have a trimer form. The hexamethylene diisocyanate oligomer may have a content of a —N═C═O group of about 16 wt % to about 24 wt %.

[Formula 1]

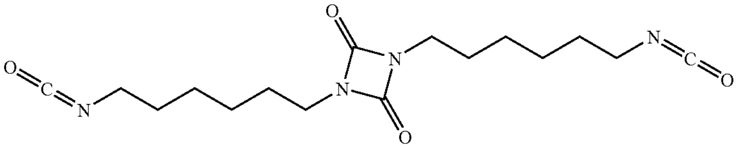

[Formula 2]

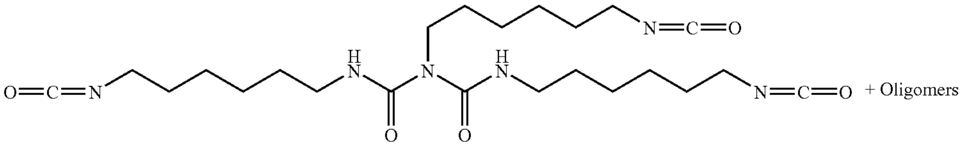

[Formula 3]

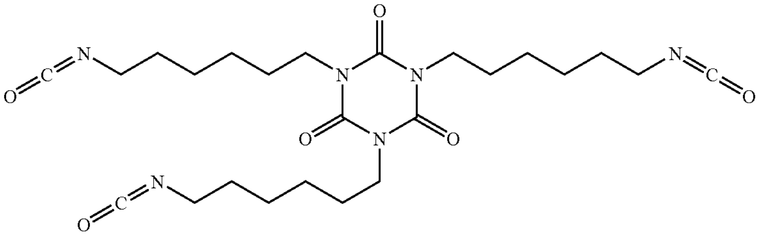

The aliphatic polyamine may include a polyaspartic ester. The amine value of the aliphatic polyamine may be about 180 mg KOH/g to about 210 mg KOH/g. The polyaspartic ester may include N, N'-(methylenedi-4,1-cyclohexanediyl) bisaspartic acid tetraethyl ester represented by Formula 4 below and/or N, N-methylenebis(2-methyl-4,1-cyclohexanediyl) bisaspartic acid tetraethyl ester represented by Formula 5 below.

[Formula 4]

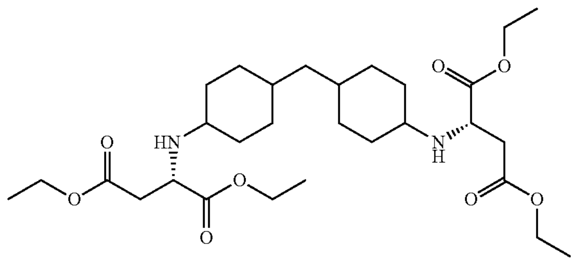

[Formula 5]

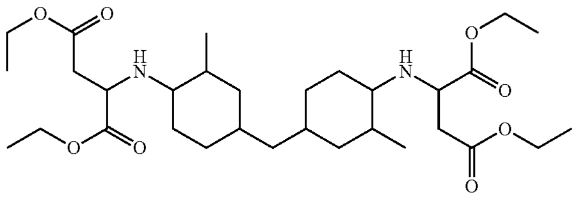

Since the polyurea included in the film portion includes the aliphatic polyisocyanate and the aliphatic polyamine, the tensile strength of the film portion 20 may be increased to improve the impact strength of the cover window 100. In addition, since the rate of a urea bond reaction between the aliphatic polyisocyanate and the aliphatic polyamine may be suitably controlled, so that the uniform and thin film portion 20 may be provided. The film portion 20 including the polyurea formed by the urea bond between the aliphatic polyisocyanate and the aliphatic polyamine may improve the impact strength and folding properties of the cover window 100. Specifically, the cover window according to the inventive concept may have an impact strength of 15 cm or greater when subjected to a pen-drop evaluation. In addition, the cover window may have a radius of curvature of 2 mm or less when subjected to an out-folding evaluation.

Figure 2:
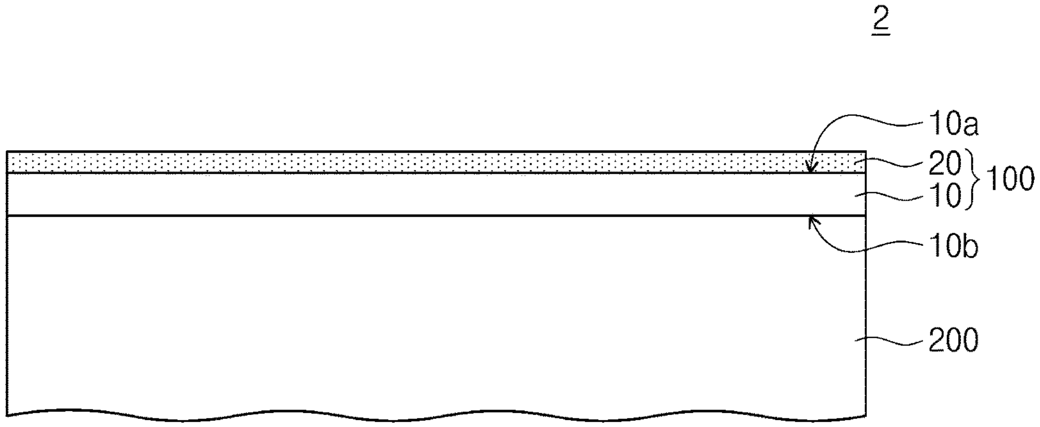
FIG. 2 is a cross-sectional view showing a portion of a display device according to another embodiment of the inventive concept.

FIG. 2 is a cross-sectional view showing a portion of a display device according to another embodiment of the inventive concept. In order to simplify the description, the same descriptions as those of the display device described with reference to FIG. 1 will be omitted.

Referring to FIG. 2, a film portion 20 may be disposed on a first surface 10*a* of a substrate 10. The substrate 10 may be interposed between the film portion 20 and a display unit 200. The film portion 20 may cover the first surface 10*a* of the substrate 10. Accordingly, the impact strength of the substrate 10 may be improved, so that the durability of a cover window 2 may be improved.

Figure 3:
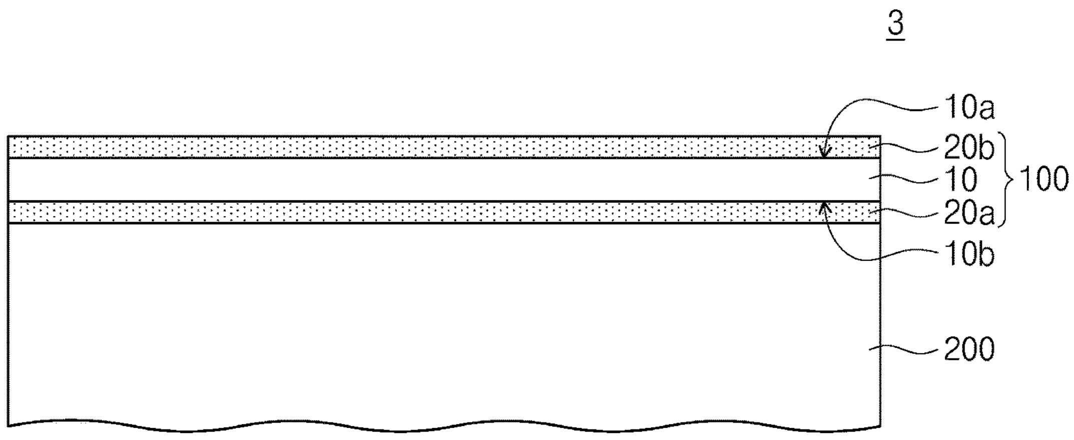
FIG. 3 is a cross-sectional view showing a portion of a display device according to another embodiment of the inventive concept.

FIG. 3 is a cross-sectional view showing a portion of a display device according to another embodiment of the inventive concept. In order to simplify the description, the same descriptions as those of the display device described with reference to FIG. 1 will be omitted.

Referring to FIG. 3, a film portion 20 may include a first film portion 20*a* and a second film portion 20*b*. The first film portion 20*a* may be disposed on a second surface 10*b* of a substrate 10. The second film portion 20*b* may be disposed on a first surface 10*a* of the substrate 10. That is, the film portion 20 may be disposed on both the first surface 10*a* and the second surface 10*b* of the substrate. Accordingly, the durability of a cover window 3 may be further improved. Each of the first film portion 20*a* and the second film portion 20 may be substantially the same as the film portion 20 described with reference to FIG. 1.

Figure 4:
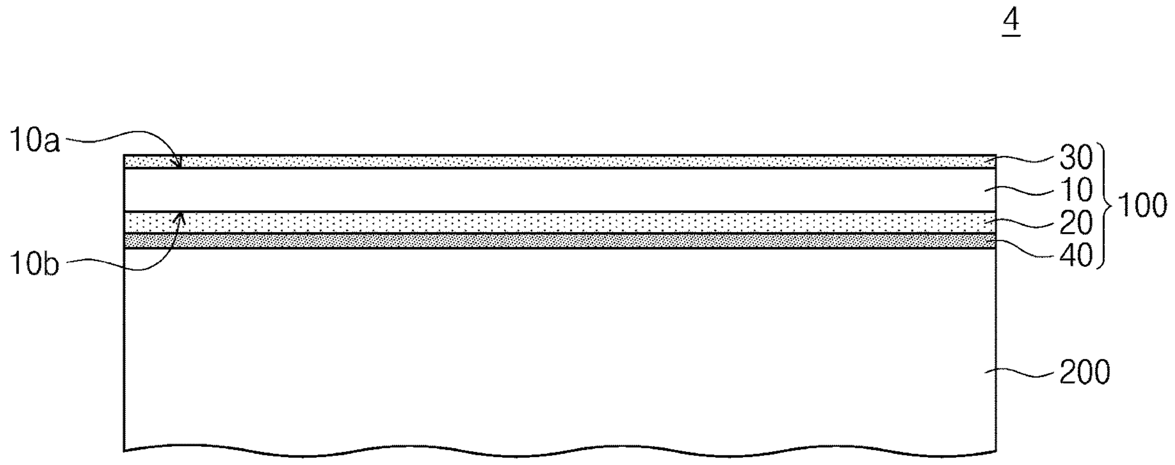
FIG. 4 is a cross-sectional view showing a portion of a display device according to another embodiment of the inventive concept.

FIG. 4 is a cross-sectional view showing a portion of a display device according to another embodiment of the inventive concept. In order to simplify the description, the same descriptions as those of the display device described with reference to FIG. 1 will be omitted.

Referring to FIG. 4, a cover window 100 may further include an anti-fingerprint layer 30 and a pressure-sensitive adhesive layer 40. The anti-fingerprint layer 30 may be disposed on a first surface 10*a* of a substrate 10. The anti-reflection layer 30 may reduce fingerprint contamination. The pressure-sensitive adhesive layer 40 may be disposed on a lower surface of a film portion 20. The pressure-sensitive adhesive layer 40 may be interposed between the film portion 20 and a display unit 200. The pressure-sensitive adhesive layer 40 may couple the film portion 20 and the display unit 200.

Figure 5:
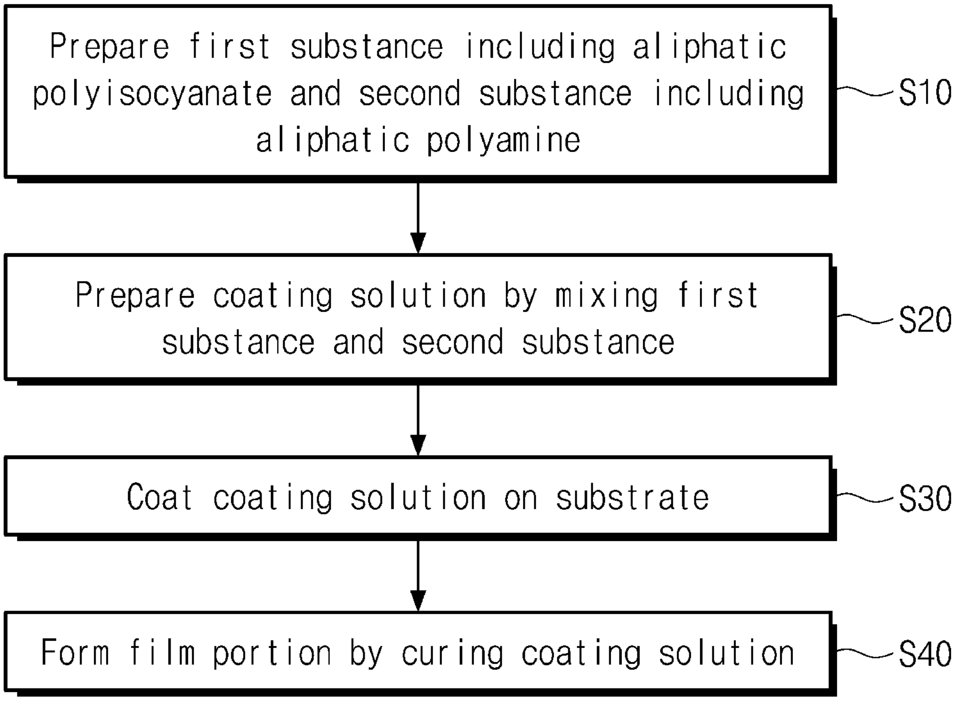
FIG. 5 is a flowchart showing a method for manufacturing a cover window according to an embodiment of the inventive concept.

FIG. 5 is a flowchart showing a method for manufacturing a cover window according to an embodiment of the inventive concept. In order to simplify the description, the same descriptions as those of the cover window described with reference to FIG. 1 will be omitted.

Referring to FIG. 1 and FIG. 5, a method for manufacturing a cover window according to an embodiment of the inventive concept includes preparing a first substance including an aliphatic polyisocyanate and a second substance including an aliphatic polyamine S10, preparing a coating solution by mixing the first substance and the second substance S20, coating the coating solution on a substrate 10 S30, and forming a film portion 20 by curing the coating solution S40.

The preparing of the first substance including the aliphatic polyisocyanate and the second substance including the aliphatic polyamine S10 may include dissolving each of the aliphatic polyisocyanate and the aliphatic polyamine in a solvent. The solvent may be acetone or methylethylketone. Since the solvent has a low boiling point, the solvent may be dried at a low temperature later. In addition, since the solvent has low density, the convex bowing of a cover window 100 may be prevented when the solvent is dried during a heat treatment process to be described later.

The preparing of the coating solution by mixing the first substance and the second substance S20 may include performing the mixing such that the ratio of the number of —N═C═O groups in the first substance and the number of —NH groups in the second substance is 1:1.

The coating of the coating solution on the substrate 10 S30 may include coating the coating solution on a second surface 10*b* of the substrate 10. The coating may be performed by a spin coating process. When the coating is performed by the spin coating process, the uniform and thin protective film portion 20 may be formed on the substrate 10.

The forming of the film portion 20 by curing the coating solution S40 may include performing a heat treatment process on the coating solution. The heat treatment process may be performed at a pressure of about 760 Torr to about 0.1 Torr and a temperature of about 60° C. to about 100° C. The temperature at which the heat treatment process is performed may be higher than the boiling point of the solvent of the coating solution. Accordingly, when the heat treatment process is performed, the solvent of the coating liquid may be dried and removed. The lower the temperature at which the heat treatment process is performed, the lower the degree of bond disorder of the urea bond, so that the mechanical properties of the film portion 20 may be improved. That is, the tensile strength and surface hardness of the film portion 20 may be improved. The lower the pressure at which the heat treatment process is performed, the easier it is to dry the solvent of the coating solution at a lower temperature, so that convex bowing may be reduced and mechanical properties may be improved.

Since polyurea included in a film portion includes an aliphatic polyisocyanate and an aliphatic polyamine, the tensile strength of the film portion may be increased to improve the impact strength of a cover window. In addition, since the rate of a urea bond reaction between the aliphatic polyisocyanate and the aliphatic polyamine may be suitably controlled, so that the uniform and thin film portion may be provided. Therefore, the cover window having improved visibility and durability may be provided.

Although the embodiments of the present invention have been described with reference to the accompanying drawings, those skilled in the art will appreciate that the present invention can be variously modified and changed without departing from the spirit and scope of the present invention as set forth in the following patent claims. In addition, the embodiments disclosed herein are not intended to limit the technical spirit of the present invention, and all technical concepts falling within the scope of the following claims and equivalents thereof are to be construed as being included in the scope of the inventive concept.

What is claimed is:

1. A cover window comprising:

a substrate; and a film portion on the substrate, wherein the film portion includes polyurea, wherein the polyurea is a polymer formed through a urea bond between an aliphatic polyisocyanate and an aliphatic polyamine, wherein the substrate is ultra-thin glass, wherein a thickness of the substrate is 30 μm to 70 μm, wherein a thickness of the film portion is 0.5 times to 1 times the thickness of the substrate.

2. The cover window of claim 1, wherein the aliphatic polyisocyanate comprises a hexamethylene diisocyanate oligomer.

3. The cover window of claim 2, wherein the hexamethylene diisocyanate oligomer comprises at least one of oligomers represented by Formula 1, Formula 2, and Formula 3:

[Formula 1]

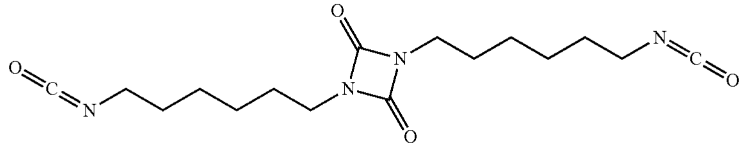

[Formula 2]

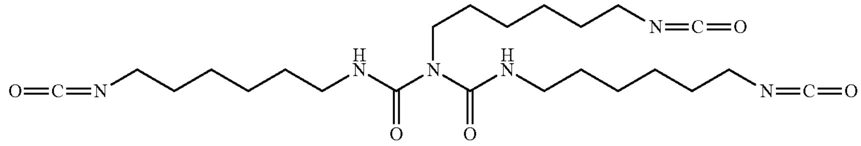

+ Oligomers

[Formula 3]

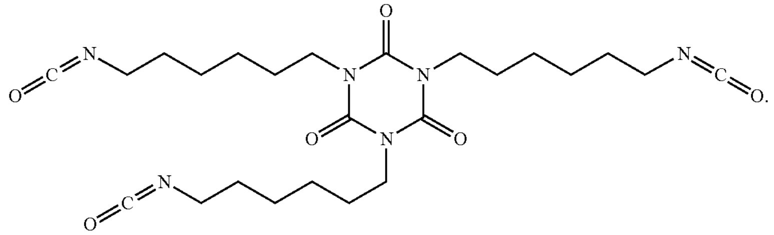

4. The cover window of claim 2, wherein the hexamethylene diisocyanate oligomer has a content of a —N=C=O group of about 16 wt % to about 24 wt %.

5. The cover window of claim 1, wherein:

the aliphatic polyamine comprises a polyaspartic ester; and the amine value of the aliphatic polyamine is about 180 mg KOH/g to about 210 mg KOH/g.

6. The cover window of claim 1, wherein the aliphatic polyamine comprises at least one of a material represented by Formula 4 and a material represented by Formula 5:

[Formula 4]

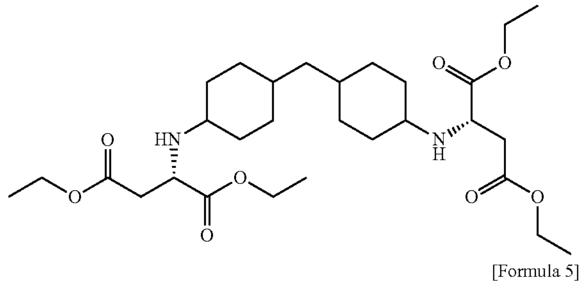

[Formula 5]

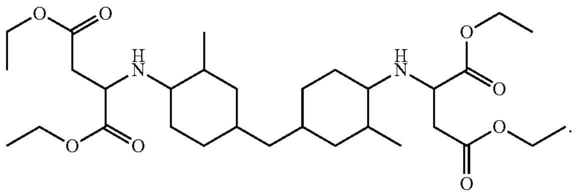

7. The cover window of claim 1, wherein the substrate comprises a first surface and a second surface which oppose each other, wherein the film portion includes a first film portion disposed on the first surface of the substrate, and a second film portion disposed on the second surface of the substrate.

8. A display device comprising:

a display unit; and a cover window on the display unit, wherein the cover window includes:

a substrate having a first surface and a second surface which opposite each other; and a film portion disposed on at least one of the first surface and the second surface of the substrate, wherein the film portion includes polyurea, wherein the polyurea is a polymer formed through a urea bond between an aliphatic polyisocyanate and an aliphatic polyamine, wherein the substrate is ultra-thin glass, wherein a thickness of the substrate is 30 μm to 70 μm, wherein a thickness of the film portion is 0.5 times to 1 times the thickness of the substrate.

9. The display device of claim 8, wherein the aliphatic polyisocyanate comprises a hexamethylene diisocyanate oligomer, wherein the hexamethylene diisocyanate oligomer has a content of a —N=C=O group of about 16 wt % to about 24 wt %.

10. The display device of claim 9, wherein the hexamethylene diisocyanate oligomer comprises at least one of oligomers represented by Formula 1, Formula 2, and Formula 3:

[Formula 1]

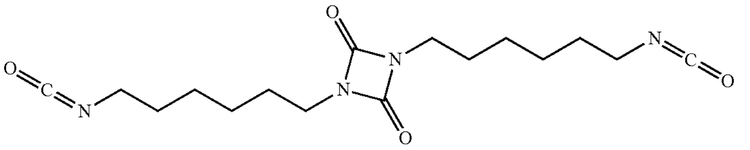

[Formula 2]

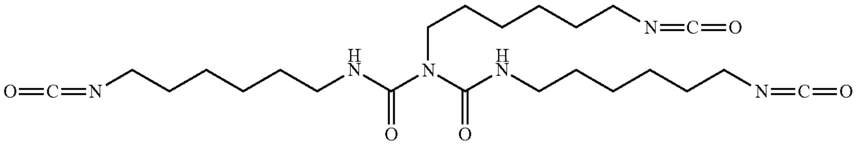

+ Oligomers

[Formula 3]

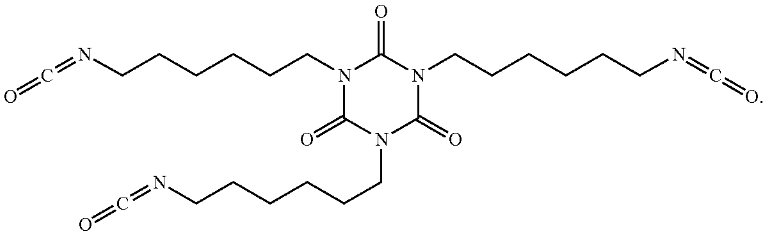

11. The display device of claim 8, wherein the aliphatic polyamine comprises at least one of a material represented by Formula 4 and a material represented by Formula 5:

[Formula 4]

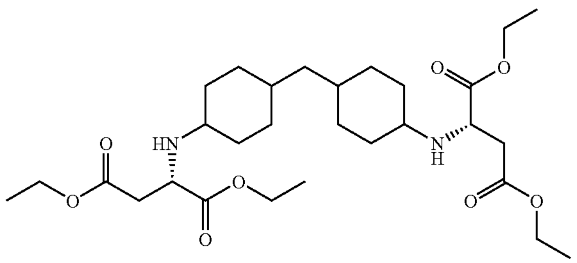

[Formula 5]

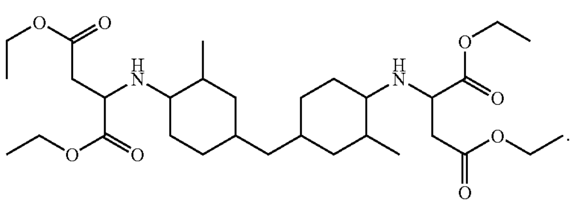

12. The display device of claim 8, wherein:

the film portion is interposed between the display unit and the substrate; and the cover window further comprises an anti-fingerprint layer and a pressure-sensitive adhesive layer, wherein:

the anti-fingerprint layer is disposed on the substrate; and the pressure-sensitive adhesive layer is interposed between the film portion and the display unit.

13. A method for manufacturing a cover window, the method comprising:

preparing a first substance including an aliphatic polyisocyanate and a second substance including an aliphatic polyamine;

preparing a coating solution by mixing the first substance and the second substance;

coating the coating solution on a substrate; and forming a film portion by curing the coating solution, wherein the substrate is ultra-thin glass, wherein a thickness of the substrate is 30 μm to 70 μm, wherein a thickness of the film portion is 0.5 times to 1 times the thickness of the substrate.

14. The method of claim 13, wherein the preparing of the first substance and the second substance comprises dissolving each of the aliphatic polyisocyanate and the aliphatic polyamine in a solvent, wherein the solvent is acetone or methylethylketone.

15. The method of claim 13, wherein the preparing of the coating solution by mixing the first substance and the second substance comprises performing the mixing such that the ratio of the number of —N═C═O groups in the first substance and the number of —NH groups in the second substance is 1:1.

16. The method of claim 13, wherein the coating of the coating solution on the substrate is performed by a spin coating process.

17. The method of claim 13, wherein the forming of the film portion by curing the coating solution comprises performing a heat treatment process on the coating solution, wherein the heat treatment process is performed at a pressure of about 760 Torr to about 0.1 Torr and a temperature of about 60° C. to about 100° C.

* * * * *